US007602205B2

(12) United States Patent
Ullmann

(10) Patent No.: US 7,602,205 B2
(45) Date of Patent: Oct. 13, 2009

(54) ELECTROMIGRATION TESTER FOR HIGH CAPACITY AND HIGH CURRENT

(75) Inventor: Jens Ullmann, San Jose, CA (US)

(73) Assignee: Qualitau, Inc., Sunnyvale, CA (US)

( * ) Notice: Subject to any disclaimer, the term of this patent is extended or adjusted under 35 U.S.C. 154(b) by 0 days.

(21) Appl. No.: 12/033,270

(22) Filed: Feb. 19, 2008

(65) Prior Publication Data

US 2009/0206869 A1 Aug. 20, 2009

(51) Int. Cl.
  *G01R 31/26* (2006.01)
  *G01R 31/02* (2006.01)
(52) U.S. Cl. .................. 324/765; 324/763; 324/158.1; 327/321; 327/322; 361/91.5; 361/93.9
(58) Field of Classification Search ......... 324/754–765; 327/321–322; 361/91.5, 93.9
  See application file for complete search history.

(56) References Cited

U.S. PATENT DOCUMENTS

| | | | |
|---|---|---|---|
| 4,628,268 | A | 12/1986 | Matsubara |
| 6,087,817 | A | 7/2000 | Varga |
| 6,480,978 | B1 | 11/2002 | Roy et al. |
| 6,614,251 | B2 * | 9/2003 | Ootsuji ................. 324/765 |
| 6,819,124 | B1 * | 11/2004 | Allee et al. ............ 324/713 |

OTHER PUBLICATIONS

IBM Technical Disclosure Bulletin Sep. 1971, NN71091070.*
BM Technical Disclosure Bulletin Jan. 1985, NN85014744.*
International Search Report from PCT/US2008/087009, mailed Feb. 3, 2009.
Written Opinion from PCT/US2008/087009, mailed Feb. 3, 2009.

* cited by examiner

*Primary Examiner*—Ha Tran T Nguyen
*Assistant Examiner*—Emily Y Chan
(74) *Attorney, Agent, or Firm*—Beyer Law Group LLP

(57) ABSTRACT

An electronic device under test (DUT) may be incorporated into a circuit having a voltage limiter connected in parallel with the DUT. The circuit includes a controlled current source having an output current connected in series with the DUT. The voltage limiter is characterized in that, when the output current is such that the voltage across the DUT (Vdut) would exceed a particular maximum voltage Vmax, without the voltage limiter in place, at least a portion of the output current flows through the voltage limiter, so as to limit Vdut to be less than or equal to Vmax. When the output current is such that Vdut would be less than or equal to Vmax, current does not flow through the voltage limiter. The circuit may include a plurality of DUTs, each DUT connected in series with the output current of a controlled current source, with a voltage limiter connected in parallel with each DUT.

8 Claims, 5 Drawing Sheets

I - V Characteristics of Ideal Limiter, Diode Limiter, and the resulting DUT Current

ELECTROMIGRATION TESTER FOR HIGH CAPACITY AND HIGH CURRENT

BACKGROUND

A growing number of electromigration tests are aimed at high current applications, where the Device Under Test (DUT) has very low resistance. The most typical example is a solder bump contact ("solder-bump"), used in a variety of packages of semiconductors chips. In such tests, stress currents as high as 2.0 Amperes are often required.

Once the DUT sustains significant damage due to electromigration, its resistance and dissipated power may increase dramatically to the point where the thermal damage can be catastrophic. At first look this should not be an issue, as the DUT has already gone through the test; however, such a thermal damage can make post-test failure analysis practically impossible.

A common approach is to disconnect the stressing current from the DUT, once the necessary level of degradation is reached. Unfortunately, electromigration testers often cannot act sufficiently fast to prevent catastrophic damage to the DUT before such action is taken. Another idea is to limit the compliance voltage of the stressing current source to the point where the voltage drop across the DUT is limited. For example, the limit may be set to a low enough level not to obscure the necessary post-test failure analysis, and yet high enough to sustain sufficient degradation. This idea, while valid in principle, is probably not very practical, considering that voltage drops across stressed solder-bumps are often 0.1 Volt or less. Also, power supplies with very low voltage and high output current are both uncommon and difficult to make.

In this patent application, we describe a novel way to address and resolve this problem, with minimal or no negative impact on all other test parameters and features. Furthermore, it provides a new option to enhance DUT capacity, with little if any additional constraints.

SUMMARY

A method of conducting an electromagnetic test of an electronic device under test (DUT) includes incorporating the DUT into a circuit having a voltage limiter connected in parallel with the DUT. The circuit includes a controlled current source having an output current connected in series with the DUT. The voltage limiter is characterized in that, when the output current is such that the voltage across the DUT (Vdut) would exceed a particular maximum voltage Vmax, without the voltage limiter in place, at least a portion of the output current flows through the voltage limiter, so as to limit Vdut to be less than or equal to Vmax. When the output current is such that Vdut would be less than or equal to Vmax, current does not flow through the voltage limiter.

The circuit may include a plurality of DUTs, each DUT connected in series with the output current of a controlled current source, with a voltage limiter connected in parallel with each DUT.

DETAILED DESCRIPTION

Figure 1:
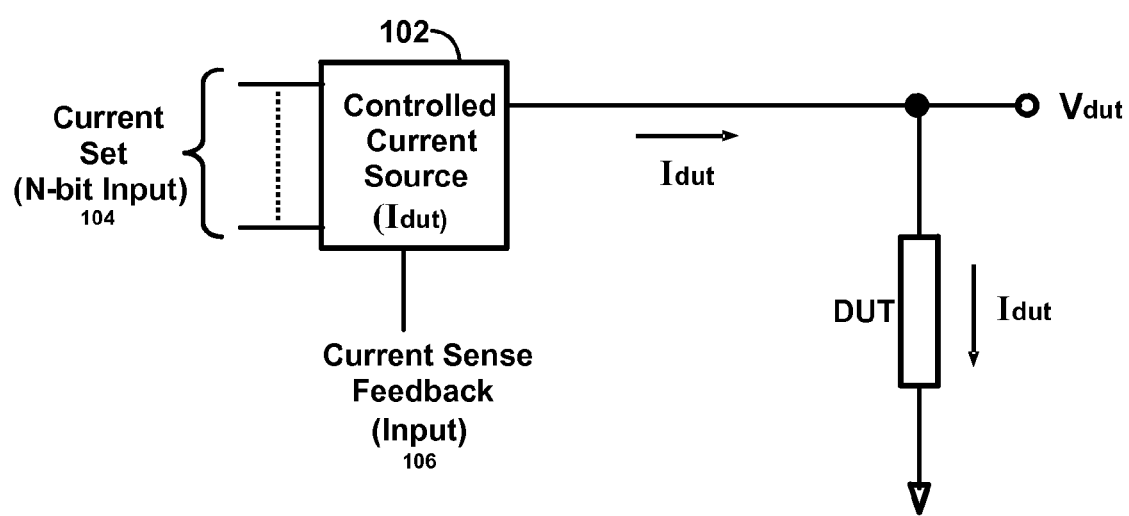
FIG. 1 is a conceptual schematic description of a typical electromigration setup for a device under test (DUT).

A conceptual schematic description of a typical electromigration setup is shown in FIG. 1. The current source 102 is driven by a user-specified input 104, which sets the required current, while a direct feedback 106 from the sensed current assures continuous, stable, and accurate current flow. The resulting voltage across the DUT (Vdut) is usually limited by the power-supplies of the current source. Therefore, the selection of power supplies would generally depend on the DUTs and range of current to be used, so that under the most extreme conditions defined by the user—the resulting voltage drop across the DUT (Vdut) will not be clamped to an insufficient level. However, if the desired clamping voltage cannot exceed 1.0 Volt, such a low power supply may be difficult to find. An alternative is to provide a simple, yet effective, voltage limiter—mainly suitable for low compliance voltage levels.

For example, suppose that the Controlled Current Source (CCS) 102 is fed by a 5 Volt power supply, and the compliance voltage should not exceed 1.0 Volt or so. In accordance with an aspect illustrated in FIG. 2, a voltage limiter (VL) may be added to the circuit in FIG. 1, such as with the following features:

For $Vdut=IdutRdut \leq Vmax$ $IL => 0$ (1)

For $IL > 0$ $VL = Vdut = Vmax$ (2)

Figure 2:
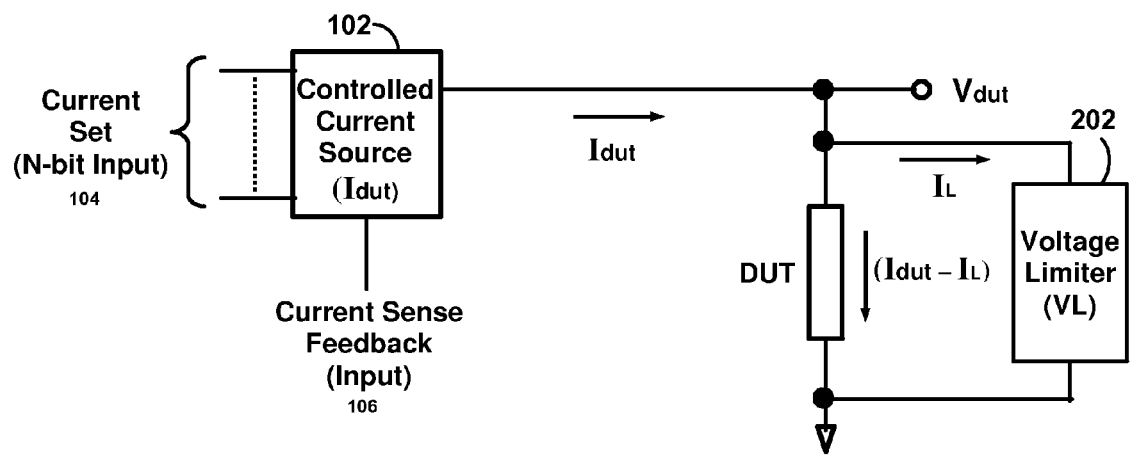
FIG. 2 is a schematic description of an electromigration setup in which a voltage limiter (VL) is provided in parallel with the DUT.

An example of this configuration is shown in FIG. 2. The FIG. 2 circuit includes a voltage limiter 202, which allows a portion of what would be the device current, Idut, to go through the voltage limiter 202.

Figure 3:
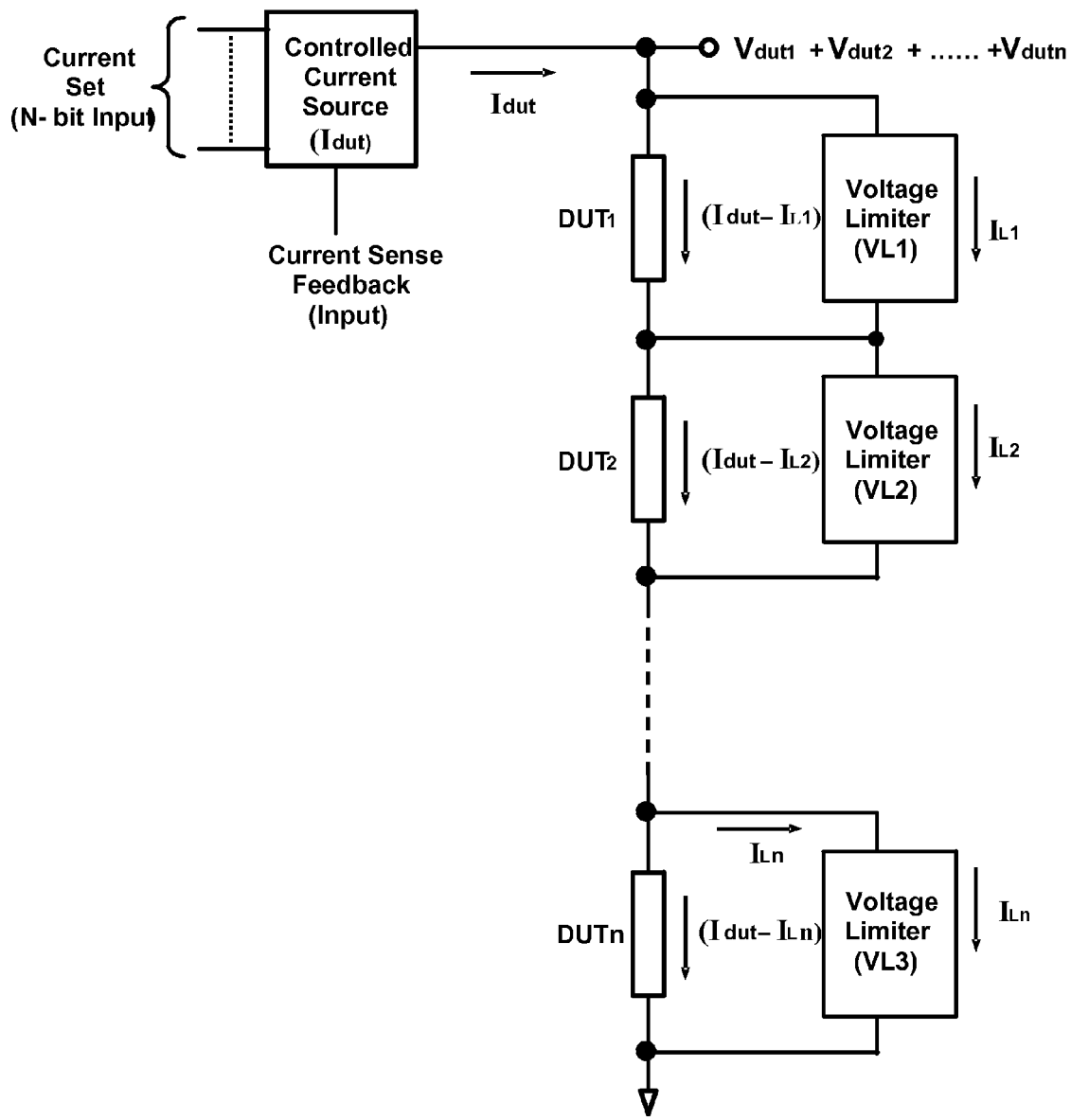
FIG. 3 is a schematic description of an electromigration setup for a plurality of DUTs, with a VL provided in parallel with each DUT.

Furthermore, the fact that Vmax<<Vcompliance, where Vcompliance is practically the power supply voltage less intrinsic and parasitic voltage drops along the output current path (i.e. across cables, internal wiring, and internal electronics) allows for connection of several sections in series, where a section is a DUT and a corresponding Voltage Limiter in parallel. Such a setup is shown in FIG. 3.

As long as none of the DUTs degrades far enough to activate its corresponding Voltage Limiter, the intended stress current Idut flows through each and every DUT. When a DUT degrades far enough to activate its corresponding Voltage Limiter, the other DUTs will not be affected, as the current flowing through them remains unchanged. This powerful feature allows multi-DUT stressing by a single current source, without negative impact on accuracy and sensitivity.

We now describe properties of an actual implementation. An ideal limiter (relations (1) and (2) described above) is not available in practice. However, simple devices can perform quite similarly, as shown in FIG. 4, where the Current vs Voltage characteristic (I-V) of a power P-N junction (diode) is plotted, with the "ideal" limiter provided as a reference.

Figure 4:
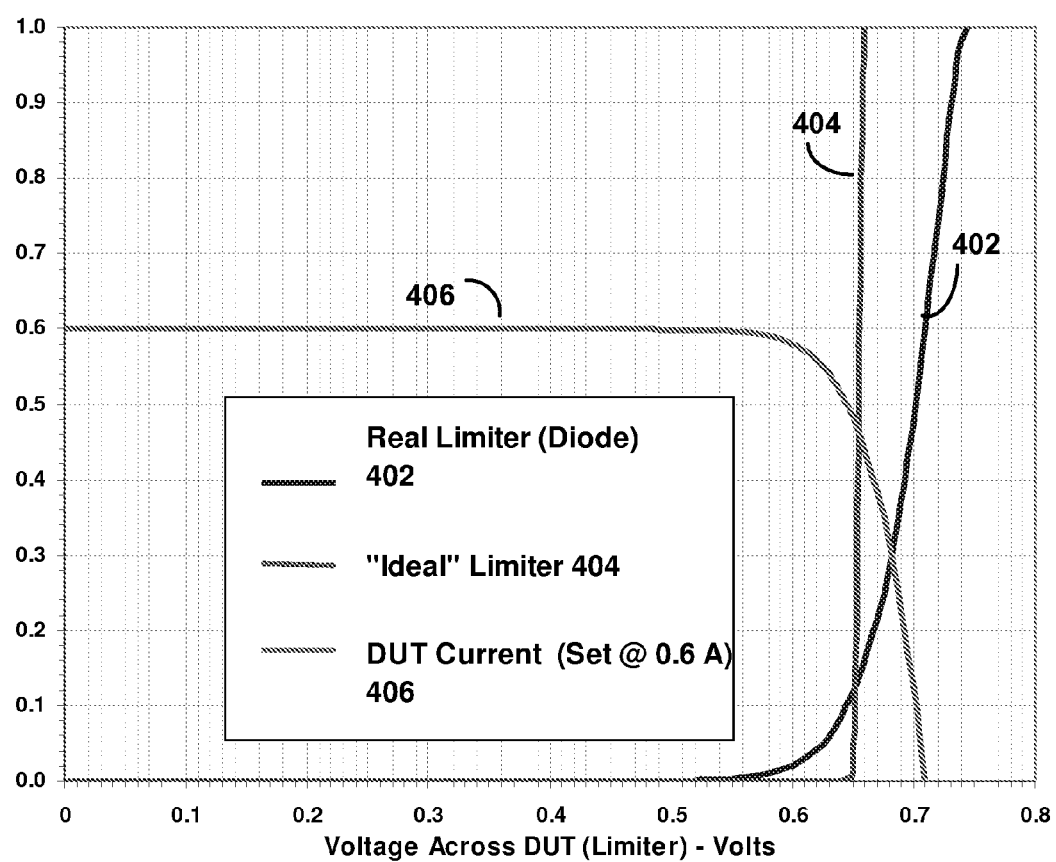
FIG. 4 is a graph of the Current vs Voltage characteristic (I-V) of a power P-N junction (diode), usable as a VL, with the characteristic of an "ideal" limiter also graphed for reference.

Referring to FIG. 4, the red line describes an Ideal limiter, where until the voltage drop across the DUT reaches Vmax (in this example 0.65 V)—no current flow through the limiter, and the entire Idut (600 mA in this example) flows through the DUT. Once the voltage drop across the DUT exceeds Vmax, the current flows through the limiter, which has an "ideal" zero dynamic resistance in this region. A realistic yet powerful implementation is attained by a power-diode (Blue curve).

Figure 5:
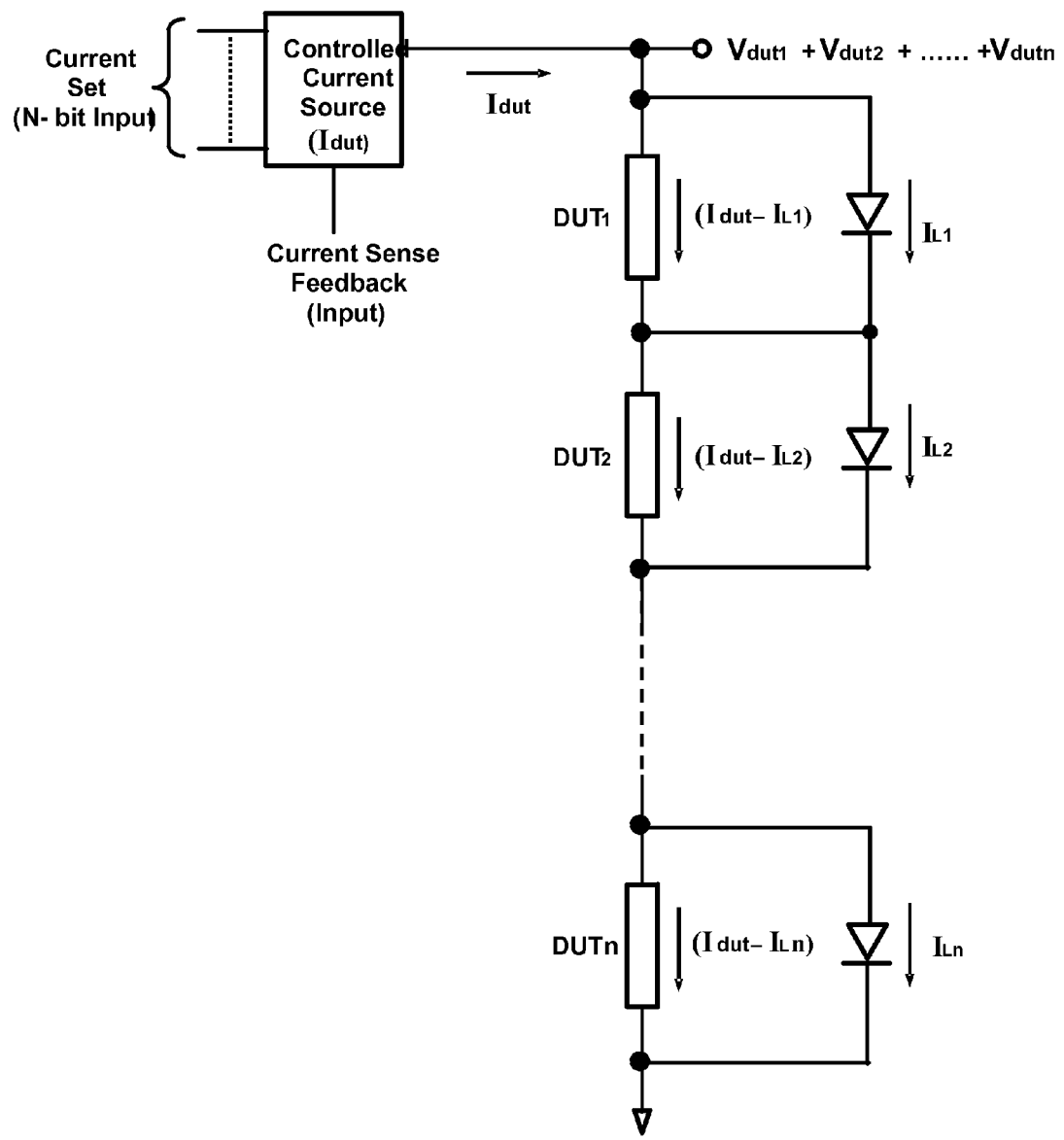
FIG. 5 is a schematic description of an electromigration setup for a plurality of DUTs, with a diode VL provided in parallel with each DUT.

Similar to the ideal limiter, the current through the diode is negligible for most of the range where Vdut<Vamx. However, rather than turning abruptly into an ideal conductor at Vdut=Vmax+, it exhibits a transition region, where its current grows rapidly but not abruptly. The resulting current through the DUT is depicted in purple, showing a transition-range of approximately 0.15 V around Vmax. One embodiment of the invention, with diodes as limiters, is shown in FIG. 5.

In another embodiment, Vmax can be lowered from a typical value of 0.7 V, down to 0.4 V using Schottky diodes, rather than silicon junction diodes. In another embodiment, a chain of several diodes in series can replace a single diode. Thus, for example, a single-diode Vmax can be extended to "N" times its original value; N being the number of similar diodes in series.

In fact, there are various electronic devices that show, under certain conditions, I-V characteristics with voltage limiting action. For example, Zener/Avalanche diodes, bipolar transistors under breakdown ("snap-back"), and others. In such devices, Vmax typically cannot be adjusted for a given device, but there is a wide range of devices with different values of Vmax. In yet another class of limiters, a special limiting circuit, rather than a single device, is used—yielding a steeper I-V slope for Vdut>Vmax, as well as adjustable Vmax. Related disadvantages may be complexity, cost, and physical space—so in reality, embodiments with such limiting circuits may be less practical than the basic embodiments described above.

This invention in a broad aspect is not limited to the specific embodiments described in the detail. In fact, any voltage limiter used in agreement with the concept of this invention should be regarded as part of a broad aspect of the invention.

What is claimed is:

1. A method of conducting an electromagnetic test of an electronic device under test (DUT), the method comprising:
    incorporating the DUT into a circuit comprising:
    a controlled current source, with the controlled current source having an output current connected in series with the DUT; and
    a voltage limiter connected in parallel with the DUT, the voltage limiter characterized in that:
        when the output current is such that the voltage across the DUT (Vdut) without the voltage limiter in place, would exceed a particular maximum voltage Vmax, at least a portion of the output current flows through the voltage limiter, so as to limit Vdut to be less than or equal to Vmax; and
    when the output current is such that Vdut is less than or equal to Vmax, current does not flow through the voltage limiter,
    and wherein the voltage limiter is characterized by a transition region surrounding Vmax for the DUT such that, as the voltage for the DUT approaches and passes Vmax, the portion of the output current flowing through the voltage limiter gradually increases to cause the output current through the DUT to correspondingly gradually decrease.

2. The method of claim 1, wherein:
    the voltage limiter is characterized by a current-voltage characteristic of a diode.

3. The method of claim 1, wherein:
    the voltage limiter is characterized by a current-voltage characteristic of a silicon junction diode.

4. The method of claim 1, wherein:
    the voltage limiter is characterized by a current-voltage characteristic of a Schottky diode.

5. The method of claim 1, wherein:
    the voltage limiter includes a plurality of diodes in series.

6. A method to conduct an electromagnetic test of a plurality of electronic DUTs simultaneously, comprising:
    incorporating the plurality of DUTs into a circuit comprising:
    a controlled current source, with the controlled current source having an output current connected in series with the DUTs; and
    a plurality of voltage limiters, such that each DUT has a corresponding voltage limiter connected in parallel with that DUT, wherein:
        when the output current is such that the voltage across that DUT (Vdut) without the voltage limiter corresponding to that DUT in place, would exceed a particular maximum voltage Vmax for that DUT, at least a portion of the output current flows through the voltage limiter corresponding to that DUT, so as to limit Vdut for that DUT to be less than or equal to Vmax for that DUT; and
    when the output current is such that Vdut is less than or equal to Vmax, current does not flow through the voltage limiter,
    and wherein the voltage limiter is characterized by a transition region surrounding Vmax for that DUT such that, as the voltage for that DUT approaches and passes Vmax, the portion of the output current flowing through the voltage limiter corresponding to that DUT gradually increases to cause the output current through that DUT to correspondingly gradually decrease.

7. A circuit configured for an electromagnetic test of a DUT, the circuit comprising:
    a controlled current source, with the controlled current source having an output current connected in series with the DUT; and
    a voltage limiter connected in parallel with the DUT, the voltage limiter characterized in that:
        when the output current is such that the voltage across the DUT (Vdut) would exceed a particular maximum voltage Vmax, without the voltage limiter in place, at least a portion of the output current flows through the voltage limiter, so as to limit Vdut to be less than or equal to Vmax; and
    when the output current is such that Vdut is less than or equal to Vmax, current does not flow through the voltage limiter,
    and wherein the voltage limiter is characterized by a transition region surrounding Vmax for that DUT such that, as the voltage for that DUT approaches and passes Vmax, the portion of the output current flowing through the voltage limiter corresponding to that DUT gradually increases to cause the output current through that DUT to correspondingly gradually decrease.

8. A circuit configured for an electromagnetic test of a plurality of electronic DUTs simultaneously, comprising:
    a controlled current source, with the controlled current source having an output current connected in series with the DUTs; and
    a plurality of voltage limiters, such that each DUT has a corresponding voltage limiter connected in parallel with that DUT,
    wherein the circuit is configured such that,
        when the output current is such that the voltage across that DUT (Vdut) without the voltage limiter corresponding to that DUT in place, would exceed a particular maximum voltage Vmax for that DUT, at least a portion of the output current flows through the voltage limiter corresponding to that DUT, so as to limit Vdut for that DUT to be less than or equal to Vmax for that DUT; and when the output current is such that Vdut is less than or equal to Vmax, current does not flow through the voltage limiter, and wherein the voltage limiter is characterized by a transition region surrounding Vmax for that DUT such that, as the voltage for that DUT approaches and passes Vmax, the portion of the output current flowing through the voltage limiter corresponding to that DUT gradually increases to cause the output current through that DUT to correspondingly gradually decrease.

* * * * *